US008631558B2

(12) United States Patent
Liang

(10) Patent No.: US 8,631,558 B2
(45) Date of Patent: Jan. 21, 2014

(54) METHOD FOR MAKING DUST COVER, ELECTRONIC DEVICE, AND METHOD FOR FIXING DUST COVER TO ELECTRONIC DEVICE HOUSING

(75) Inventor: Yan Liang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 200 days.

(21) Appl. No.: 13/220,963

(22) Filed: Aug. 30, 2011

(65) Prior Publication Data

US 2012/0147534 A1 Jun. 14, 2012

(30) Foreign Application Priority Data

Dec. 14, 2010 (CN) .......................... 2010 1 0586947

(51) Int. Cl.
*H05K 5/00* (2006.01)

(52) U.S. Cl.
USPC ...... 29/592; 29/592.1; 29/592.4; 361/679.01; 361/679.02

(58) Field of Classification Search
None
See application file for complete search history.

(56) References Cited

U.S. PATENT DOCUMENTS

| | | | | |
|---|---|---|---|---|
| 5,828,012 | A * | 10/1998 | Repolle et al. | 181/175 |
| 8,055,003 | B2 * | 11/2011 | Mittleman et al. | 381/345 |
| 8,091,680 | B2 * | 1/2012 | Killion et al. | 181/130 |
| 8,112,130 | B2 * | 2/2012 | Mittleman et al. | 455/575.1 |
| 8,141,678 | B2 * | 3/2012 | Ikeyama et al. | 181/175 |
| 8,442,254 | B2 * | 5/2013 | Yu et al. | 381/334 |
| 2012/0033846 | A1 * | 2/2012 | Kaplan et al. | 381/386 |

FOREIGN PATENT DOCUMENTS

EP 0611111 A1 8/1994

* cited by examiner

*Primary Examiner* — Anthony Q Edwards
(74) *Attorney, Agent, or Firm* — Altis Law Group, Inc.

(57) ABSTRACT

A dust cover includes an anti-dust portion and an adhering portion integrally formed for framing the anti-dust portion. The anti-dust portion is a mesh sheet. The adhering portion is integrally formed on the anti-dust portion via a heat pressing process. The anti-dust portion is a coarser mesh, and the adhering portion is a mesh sheet with finer holes. The disclosure further provides a method for making the dust cover and an electronic device using the dust cover.

11 Claims, 5 Drawing Sheets

METHOD FOR MAKING DUST COVER, ELECTRONIC DEVICE, AND METHOD FOR FIXING DUST COVER TO ELECTRONIC DEVICE HOUSING

BACKGROUND

1. Technical Field

The present disclosure relates to dust covers and, particularly, to a dust cover for a speaker hole, a method for making the dust cover and an electronic device using the same.

2. Description of Related Art

Electronic devices are usually equipped with speakers. The electronic device includes a housing defining a speaker hole, and a speaker assembled within the housing facing the speaker hole. In order to prevent contaminants such as dust and moisture from penetrating the electronic device through the speaker hole, some type of dust cover is assembled to the housing to cover or shield the speaker hole of the electronic device.

However, the existing dust covers are difficult to be assembled to the housing, and the method for manufacturing the dust covers is complex and costly.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
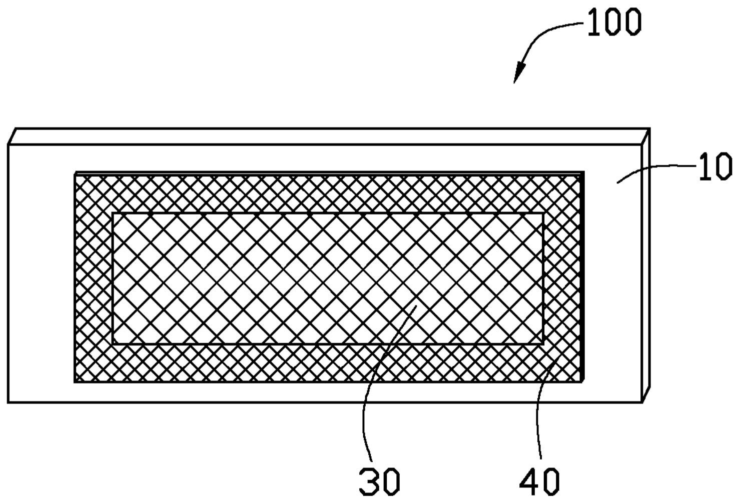
FIG. 1 is an isometric view of an embodiment of an electronic device, including a dust cover and a housing.
Figure 2:
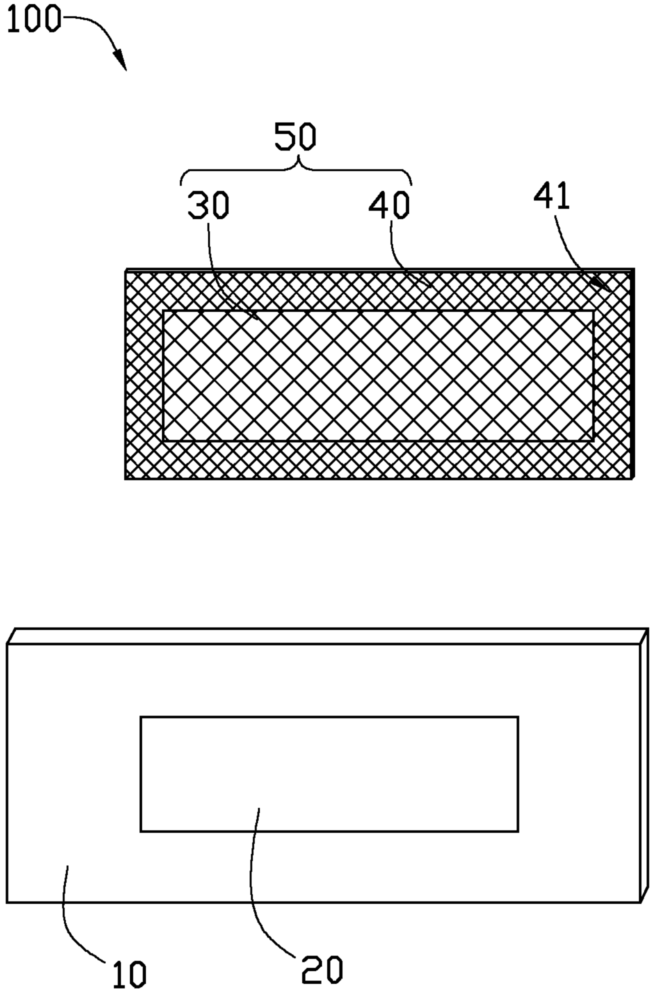
FIG. 2 is an exploded, isometric view of the electronic device of FIG. 1.
Figure 3:
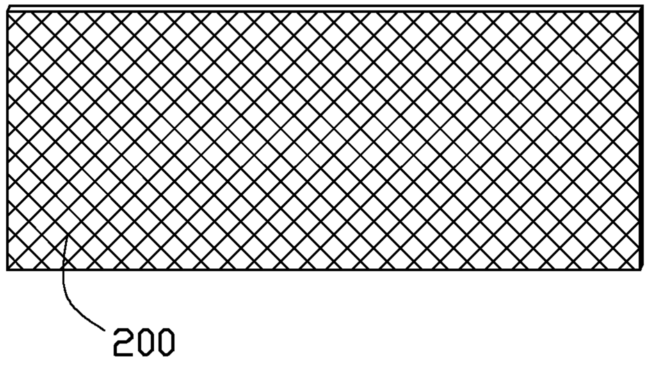
FIG. 3 is a schematic view of a mesh object for forming a dust cover.
Figure 4:
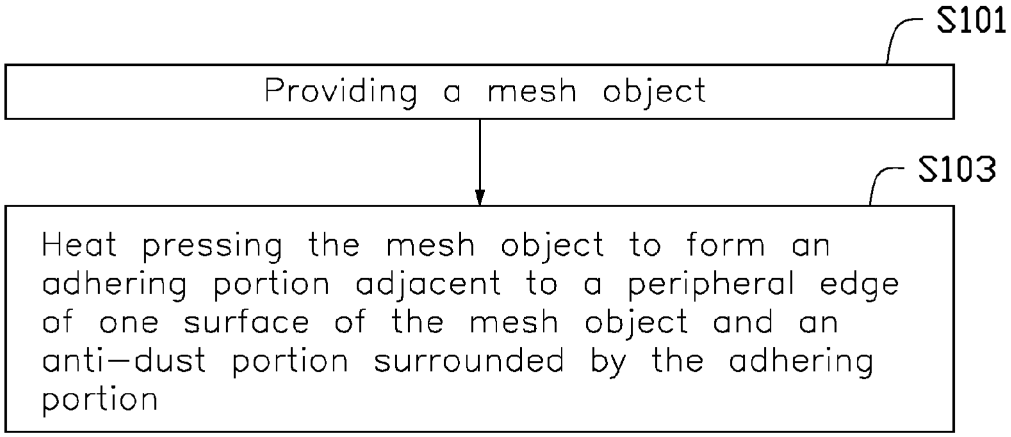
FIG. 4 shows a flow chart of a method for making the dust cover of FIG. 1.

Referring to FIGS. 1 and 2, an embodiment of an electronic device 100 such as a computer, a mobile phone, a camera, or the like, includes a housing 10, a speaker (not shown), and a dust cover 50. The housing 10 defines a speaker hole 20 therethrough. The speaker hole 20 is substantially rectangular in the illustrated embodiment. The speaker is mounted within the housing 10 and positioned adjacent to and facing toward the speaker hole 20. The dust cover 50 is fixedly mounted to the housing 10 for covering the speaker hole 20, thereby preventing the penetration by contaminants such as dust entering into the interior of the electronic device 100 via the speaker hole 20.

In the illustrated embodiment, the dust cover 50 is fixedly mounted to the housing 10 via a double-sided adhesive tape (not shown). The dust cover 50 includes an anti-dust portion 30 that is a substantially rectangular mesh sheet and an adhering portion 40 integrally formed to frame the anti-dust portion 30. The adhering portion 40 is an encircled frame integrally formed adjacent to a peripheral edge of one surface of the anti-dust portion 30. The adhering portion 40 is also a mesh sheet but with a plurality of finer holes, and is fixed in place by a heat pressing process, in the illustrated embodiment.

Because the adhering portion 40 has a finer mesh, it has greater surface area, thereby allowing a stronger bond with the double-sided tape, such that the dust cover 50 is more easily adhered to the housing 10, . . . . Meanwhile, the anti-dust portion 30 is of a coarser mesh, so that although it can prevent the penetration of contaminants, it does not substantially interfere with the passage of sound from the speaker. A bonding force formed between an adhering surface 41 of the adhering portion 40 of the dust cover 50 and the housing 10 is efficiently enhanced, thereby preventing the dust cover 50 detaching from the housing 10.

Referring to FIGS. 1 through 4, a method for making the dust cover 50 includes the following steps:

In step S101, a mesh object 200 having a preset dimension as that of the dust cover 50 is provided. In the illustrated embodiment, the mesh object 200 is made of nylon material.

In step S103, the mesh object 200 is heat pressed to form an adhering portion 40 adjacent to a peripheral edge of one surface of the mesh object 200 and an anti-dust portion 30 surrounded by the adhering portion 40, to finally obtain the dust cover 50 (shown in FIG. 2). The adhering portion 40 has an adhering surface 41 with a plurality of finer holes than that of the anti-dust portion 30. In the illustrated embodiment, a heat pressing temperature of the heat pressing process is controlled between 80 to 120 degrees Celsius. A preferred heat pressing temperature of the heat pressing process is about 96 degree Celsius.

Figure 5:
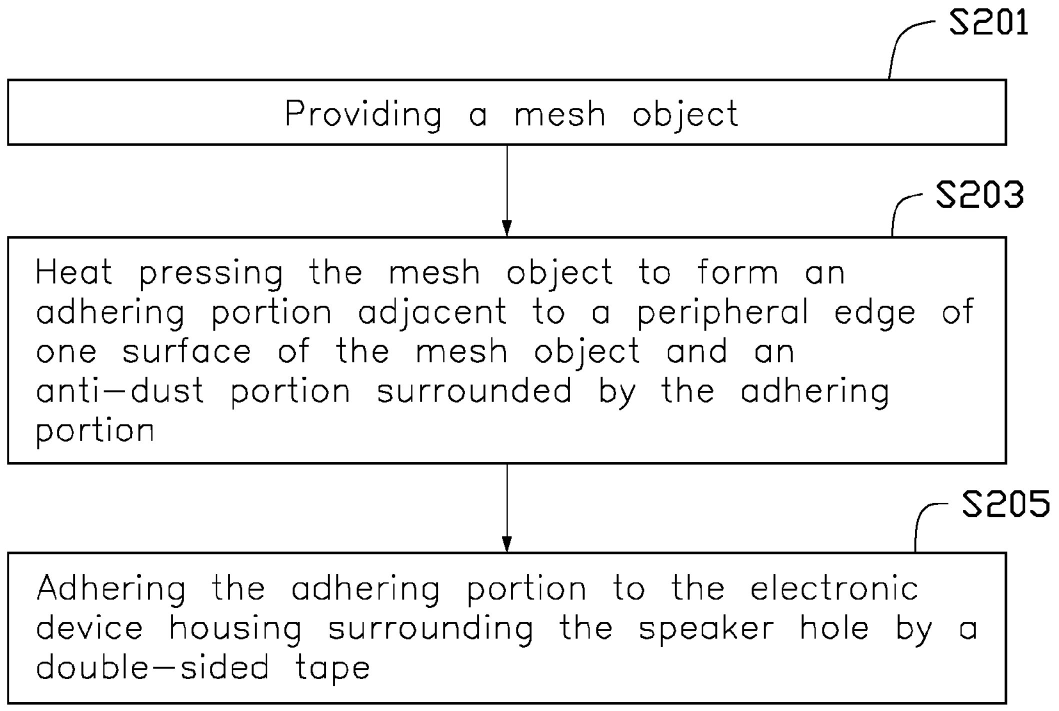
FIG. 5 shows a flow chart of a method for fixing the dust cover to the housing of FIG. 1.

Referring also to FIG. 5, a method for fixing the dust cover 50 to the housing 10 for protecting the speaker hole 20 includes the following steps:

In step S201, a mesh object 200 having a preset dimension as that of the dust cover 50 is provided. In the illustrated embodiment, the mesh object 200 is made of nylon material.

In step S203, the mesh object 200 is heat pressed to form an adhering portion 40 adjacent to a peripheral edge of one surface of the mesh object 200 and an anti-dust portion 30 surrounded by the adhering portion 40, to finally obtain the dust cover 50 (shown in FIG. 2). The adhering portion 40 has an adhering surface 41 with a plurality of finer holes than that of the anti-dust portion 30. In the illustrated embodiment, a heat pressing temperature of the heat pressing process is controlled between 80 to 120 degrees Celsius. A preferred heat pressing temperature of the heat pressing process is about 96 degree Celsius.

In step S205, the adhering portion 40 is adhered to the housing 10 surrounding the speaker hole 20 by double-sided tape, and the anti-dust portion 30 covers the speaker hole 20, such that the dust cover 50 is fixed to the housing 10 for protecting the speaker hole 20.

Although numerous characteristics and advantages of the disclosure have been set forth in the foregoing description, together with details of the structure and function of the embodiment, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A method for making a dust cover, comprising the following steps:

providing a mesh object; and heat pressing the mesh object to form an adhering portion adjacent to a peripheral edge of one surface of the mesh object and an anti-dust portion surrounded by the adhering portion;

wherein, the anti-dust portion is a coarser mesh, and the adhering portion is a mesh sheet with a plurality of finer holes.

2. The method for making the dust cover of claim 1, wherein the adhering portion has greater surface area than that of the anti-dust portion.

3. The method for making the dust cover of claim 1, wherein the mesh object is made of nylon material, and the heat pressing temperature of the heat pressing process is controlled between 80 to 120 degrees Celsius.

4. The method for making the dust cover of claim 3, wherein the heat pressing temperature of the heat pressing process is about 96 degrees Celsius.

5. An electronic device, comprising:

a housing defining a speaker hole; and a dust cover fixedly mounted to the housing for covering the speaker hole of the housing, the dust cover comprising:

an anti-dust portion being a mesh sheet; and an adhering portion, the adhering portion being an encircled frame integrally formed adjacent to a peripheral edge of one surface of the anti-dust portion;

wherein, the anti-dust portion is a coarser mesh, the adhering portion is a mesh sheet with a plurality of finer holes, the adhering portion is directly fixed to the housing surrounding the speaker hole, and the anti-dust portion covers the speaker hole.

6. The electronic device of claim 5, wherein the adhering portion comprises an adhering surface, the adhering surface of the adhering portion has greater surface area than that of the anti-dust portion.

7. A method for fixing a dust cover to an electronic device housing for protecting a speaker hole in the electronic device housing, comprising the following steps:

providing a mesh object;

heat pressing the mesh object to form an adhering portion adjacent to a peripheral edge of one surface of the mesh object and an anti-dust portion surrounded by the adhering portion; and adhering the adhering portion to the electronic device housing surrounding the speaker hole by a double-sided tape, wherein the anti-dust portion covers the speaker hole.

8. The method for fixing the dust cover to the electronic device housing of claim 7, wherein the anti-dust portion is a coarser mesh, and the adhering portion is a mesh sheet with a plurality of finer holes.

9. The method for fixing the dust cover to the electronic device housing of claim 7, wherein the adhering portion has greater surface area than that of the anti-dust portion.

10. The method for fixing the dust cover to the electronic device housing of claim 7, wherein the mesh object is made of nylon material, and the heat pressing temperature of the heat pressing process is controlled between 80 to 120 degrees Celsius.

11. The method for fixing the dust cover to the electronic device housing of claim 7, wherein the heat pressing temperature of the heat pressing process is about 96 degrees Celsius.

* * * * *